(12) United States Patent
Kwon et al.

(10) Patent No.: US 10,991,603 B2
(45) Date of Patent: Apr. 27, 2021

(54) APPARATUS AND METHOD FOR TREATING SUBSTRATE

(71) Applicant: SEMES CO., LTD., Cheonan-si (KR)

(72) Inventors: Oh Jin Kwon, Cheonan-si (KR); Chong-Min Ryu, Cheonan-si (KR); Young Ho Choo, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 16/556,025

(22) Filed: Aug. 29, 2019

(65) Prior Publication Data

US 2020/0075355 A1 Mar. 5, 2020

(30) Foreign Application Priority Data

Aug. 29, 2018 (KR) .................. 10-2018-0102297

(51) Int. Cl.
    *H01L 21/67* (2006.01)
    *H01L 21/02* (2006.01)

(52) U.S. Cl.
    CPC .. *H01L 21/67051* (2013.01); *H01L 21/02323* (2013.01); *H01L 21/02345* (2013.01); *H01L 21/6708* (2013.01); *H01L 21/6715* (2013.01)

(58) Field of Classification Search
    CPC ......... H01L 21/67051; H01L 21/02323; H01L 21/02345; H01L 21/6708; H01L 21/6715
    USPC ...................................................... 438/106
    See application file for complete search history.

(56) References Cited

U.S. PATENT DOCUMENTS

| 2001/0017191 A1* | 8/2001 | Hashimoto | ....... H01L 21/67051 156/345.21 |
| 2001/0035343 A1* | 11/2001 | Kamijima | ............ G11B 5/3163 204/192.17 |
| 2006/0237127 A1* | 10/2006 | Inatomi | ..................... G03F 7/40 156/272.2 |
| 2007/0238028 A1* | 10/2007 | Inatomi | ............. H01L 21/67184 430/5 |
| 2008/0280054 A1* | 11/2008 | Ogata | ............... H01L 21/67051 427/425 |
| 2009/0152238 A1* | 6/2009 | Inatomi | ............... H01L 21/0273 216/41 |
| 2013/0256267 A1* | 10/2013 | Ota | ................... H01L 21/67207 216/62 |
| 2013/0333722 A1* | 12/2013 | Tanaka | .................... B08B 3/003 134/1 |

(Continued)

FOREIGN PATENT DOCUMENTS

| JP | 3756092 B2 | 1/2006 |
| JP | 2008053560 A | 3/2008 |

(Continued)

OTHER PUBLICATIONS

Korean Patent Office, Office action dated Aug. 21, 2019.
Korean Patent Office, Notice of Allowance dated Mar. 31, 2020.

*Primary Examiner* — Sheikh Maruf
(74) *Attorney, Agent, or Firm* — Li & Cai Intellectual Property (USA) Office (57) ABSTRACT

A method for treating a substrate includes a mixing step of preparing an ozone treatment fluid containing an ozone gas and a substrate treating step of treating a surface of the substrate using the ozone treatment fluid. In the substrate treating step, light is irradiated to the substrate by a lamp.

15 Claims, 9 Drawing Sheets

(56) References Cited

U.S. PATENT DOCUMENTS

| | | | |
|---|---|---|---|
| 2015/0060406 A1* | 3/2015 | Negoro | B05D 1/36 |
| | | | 216/83 |
| 2015/0060407 A1* | 3/2015 | Negoro | C11D 11/0047 |
| | | | 216/92 |
| 2015/0072536 A1* | 3/2015 | Muramatsu | G03F 7/40 |
| | | | 438/781 |
| 2015/0136183 A1* | 5/2015 | Brown | H01L 21/67051 |
| | | | 134/95.3 |
| 2015/0270146 A1* | 9/2015 | Yoshihara | H01L 21/68742 |
| | | | 134/18 |
| 2015/0352669 A1* | 12/2015 | Kondo | H01L 21/67115 |
| | | | 438/7 |
| 2016/0064242 A1* | 3/2016 | Obweger | H01L 21/6708 |
| | | | 134/1.3 |
| 2016/0172257 A1* | 6/2016 | Kondo | H01L 21/6708 |
| | | | 438/7 |
| 2017/0018423 A1* | 1/2017 | Starrs | C11D 11/0064 |
| 2018/0033605 A1* | 2/2018 | Ota | H01L 21/02063 |
| 2018/0047592 A1* | 2/2018 | Fukuda | G03F 7/3021 |
| 2018/0090342 A1* | 3/2018 | Hinode | H01L 21/02057 |
| 2019/0333755 A1* | 10/2019 | Hanawa | H01L 21/67051 |

FOREIGN PATENT DOCUMENTS

| | | |
|---|---|---|
| KR | 1020020060909 A | 7/2002 |
| KR | 10-1160258 B | 6/2012 |
| KR | 1020170020192 A | 2/2017 |
| KR | 10-1770880 B | 8/2017 |
| KR | 10-2017-0137244 A | 12/2017 |
| KR | 10-1854944 B | 4/2018 |
| KR | 10-1866662 B | 6/2018 |

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2018-0102297 filed on Aug. 29, 2018, in the Korean Intellectual Property Office, the entire contents of which are hereby incorporated by reference.

BACKGROUND

Embodiments of the inventive concept described herein relate to a substrate treating apparatus and method, and more particularly, relate to an apparatus and method for stripping unnecessary photoresist (PR) from a substrate.

In general, various processes such as a photoresist coating process, a developing process, an etching process, an ashing process, and the like are performed to treat a glass substrate or a wafer in a process of manufacturing a flat panel display device or a semiconductor device.

Especially, in a semiconductor photolithography process, a substrate is sequentially subjected to a spin coating process, a soft bake process, an aligning and exposing process, a developing process, a cleaning and drying process, a hard bake process, an etching process, a photoresist stripping process, and the like. In the photolithography process, the exposing, developing, and etching processes are performed by using photoresist as a masking film, and the photoresist is removed after completely used as the masking film because the photoresist is no longer needed. The removal of the photoresist is performed through a stripping process.

In the stripping process, the photoresist is removed by using an SPM solution ($H_2SO_4+H_2O_2$) or a DSP solution ($H_2SO_4+HF+H_2O_2$) that is a chemical solution used at high temperature like sulfuric acid or phosphoric acid.

However, the existing stripping process has the following problems.

For example, in the case of the SPM solution, an intermediate product $H_2SO_5$ that sulfuric acid and hydrogen peroxide react together to produce has high reactivity and produces water to dilute the solution and shorten the lifetime thereof. Furthermore, the SPM solution has to be continually supplied because the hydrogen peroxide in the SPM solution is very unstable. Consequently, with an increase in the amount of SPM solution used, the amount of wastewater increases, and wastewater treatment cost also increases correspondingly, which leads to environmental problems.

In addition, the existing stripping process indispensably requires a mixing tank for mixing sulfuric acid and hydrogen peroxide and a heating device for maintaining the mixed stripping solution at a high temperature of 90° C. to 150° C. Due to this, a stripping apparatus using the existing stripping solution occupies a large footprint in a semiconductor clean room and fails to satisfy a requirement of clustering between processes.

SUMMARY

Embodiments of the inventive concept provide a substrate treating apparatus and method that does not incur wastewater treatment cost.

Embodiments of the inventive concept provide a substrate treating apparatus and method for enhancing the reactivity of OH radicals.

Embodiments of the inventive concept provide a substrate treating apparatus and method for improving efficiency in removing a photoresist film and an organic residue.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, a method for treating a substrate includes a mixing step of preparing an ozone treatment fluid containing an ozone gas and a substrate treating step of treating a surface of the substrate using the ozone treatment fluid. In the substrate treating step, light is irradiated to the substrate by a lamp.

The ozone treatment fluid may be ozone water in which the ozone gas is dissolved in deionized water.

In the mixing step, at least one of a nitrogen gas and carbon dioxide may be mixed with the ozone water.

In the substrate treating step, ultraviolet light may be irradiated to the substrate.

In the substrate treating step, infrared light may be irradiated to the substrate.

In the substrate treating step, ultraviolet light and infrared light may be simultaneously irradiated to the substrate.

In the substrate treating step, a heat source may be provided on a backside of the substrate, or high-temperature deionized water may be dispensed onto the backside of the substrate.

In the substrate treating step, a nozzle may dispense the ozone treatment fluid onto the rotating substrate while swinging.

In the substrate treating step, the light of the lamp may be irradiated to a region of the substrate onto which the ozone treatment fluid is dispensed.

The ozone treatment fluid may be dispensed onto the substrate after being prepared in the nozzle in the mixing step.

The ozone treatment fluid may remove a photoresist film or an organic residue on the surface of the substrate.

According to an exemplary embodiment, an apparatus for treating a substrate includes a chamber, a substrate support unit that is provided in the chamber and on which the substrate is placed, an ozone gas supply unit that supplies an ozone gas, a dispensing nozzle that dispenses, onto the substrate, an ozone treatment fluid containing the ozone gas supplied from the ozone gas supply unit, and a lamp unit that irradiates light to the substrate.

The apparatus may further include a deionized-water supply unit that supplies deionized water to the dispensing nozzle.

The dispensing nozzle may include a mixing space in which the deionized water supplied from the deionized-water supply unit and the ozone gas supplied from the ozone gas supply unit are mixed and a dispensing opening through which the ozone treatment fluid prepared in the mixing space is dispensed.

The lamp unit may irradiate the light to a region of the substrate onto which the ozone treatment fluid is dispensed.

The lamp unit may include an infrared (IR) lamp that irradiates infrared light.

The lamp unit may include an ultraviolet (UV) lamp that irradiates ultraviolet light.

The lamp unit may include a UV lamp that irradiates ultraviolet light and an IR lamp that irradiates infrared light.

The substrate support unit may include a heating unit that heats the substrate.

The substrate support unit may include a back nozzle that dispenses a high-temperature fluid onto a backside of the substrate.

The apparatus may further include a nozzle actuator that swings the dispensing nozzle to cause the dispensing nozzle to dispense the ozone treatment fluid while moving from the center of the substrate to the edge thereof.

The apparatus may further include an arm on which the dispensing nozzle and the lamp unit are mounted. The arm may be operated by the nozzle actuator.

The apparatus may further include a moving unit that moves the dispensing nozzle and the lamp unit to vary positions of the dispensing nozzle and the lamp unit relative to the substrate support unit and a controller that controls the moving unit to vary a region of the substrate to which the ozone treatment fluid and the light are supplied.

The dispensing nozzle and the lamp unit may be individually operated by separate actuators.

The apparatus may further include a catalytic gas supply unit that supplies a catalytic gas to the dispensing nozzle.

The catalytic gas supply unit may supply the catalytic gas into the mixing space.

The catalytic gas may include at least one of a nitrogen gas and carbon dioxide.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

As the inventive concept allows for various changes and numerous embodiments, exemplary embodiments will be illustrated in the drawings and described in detail in the written description. However, this is not intended to limit the inventive concept to particular modes of practice, and it should be appreciated that all changes, equivalents, and substitutes that do not depart from the spirit and scope of the inventive concept are encompassed in the inventive concept. In describing the inventive concept, detailed descriptions related to well-known functions or configurations will be omitted when they may make subject matters of the inventive concept obscure.

The terminology used herein is for the purpose of describing particular embodiments only and is not intended to limit the scope of the inventive concept. The terms of a singular form may include plural forms unless otherwise specified. It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

The terms such as first, second, and the like may be used to describe various components, but the components should not be limited by the terms. The terms may be used only for distinguishing one component from others.

Hereinafter, embodiments according to the inventive concept will be described in detail with reference to the accompanying drawings. In describing the embodiments with reference to the accompanying drawings, identical or corresponding components are provided with identical reference numerals in the drawings regardless of the reference numerals, and repetitive descriptions thereof will be omitted.

Figure 1:
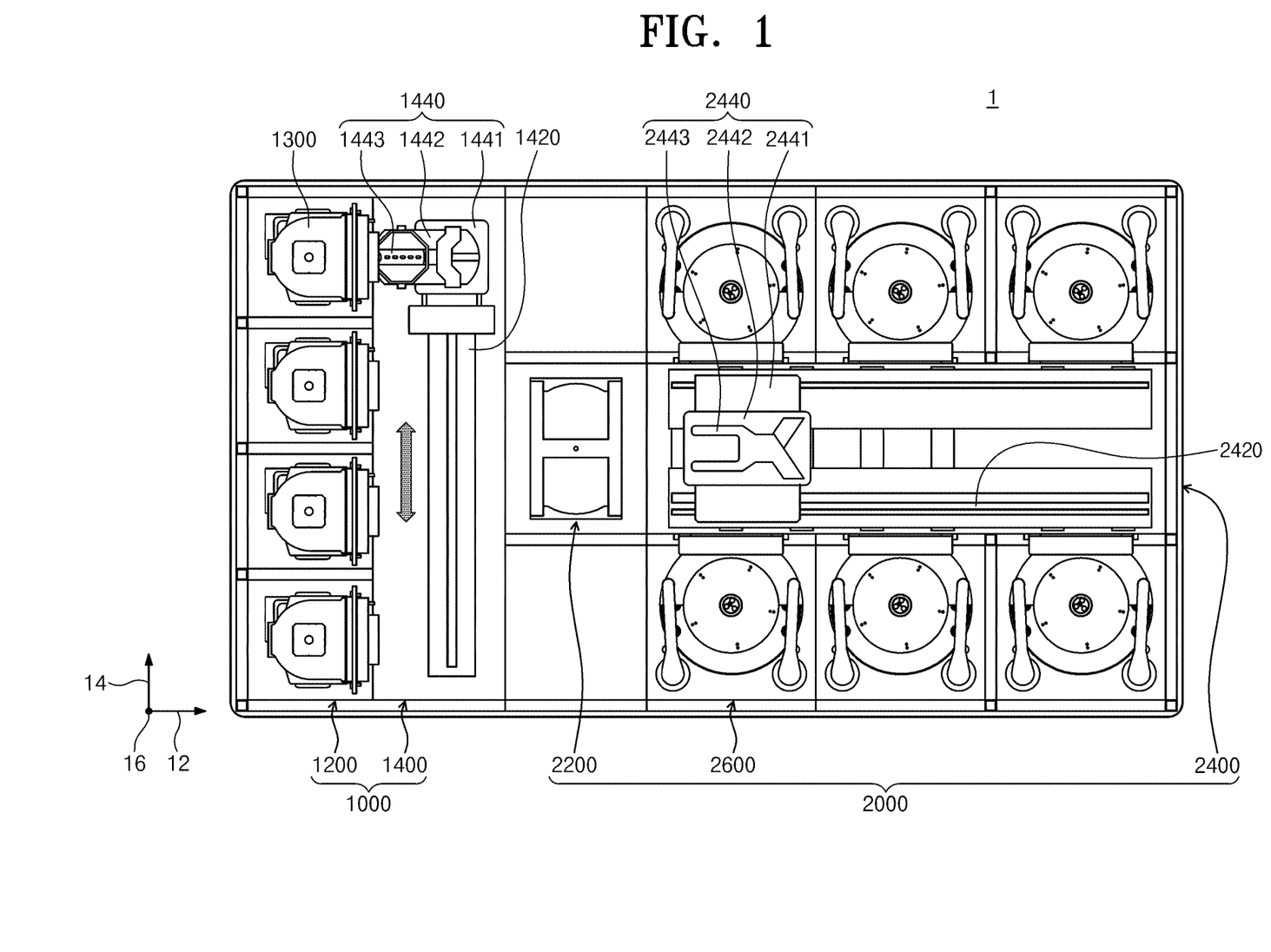
FIG. 1 is a schematic plan view illustrating substrate treating equipment including a substrate treating apparatus according to an embodiment of the inventive concept.

FIG. 1 is a schematic plan view illustrating substrate treating equipment 1 of the inventive concept.

Referring to FIG. 1, the substrate treating equipment 1 includes an index module 1000 and a process module 2000. The index module 1000 includes a load port 1200 and a transfer frame 1400. The load port 1200, the transfer frame 1400, and the process module 2000 are sequentially arranged in a row. Hereinafter, the direction in which the load port 1200, the transfer frame 1400, and the process module 2000 are arranged is referred to as a first direction 12. Furthermore, a direction perpendicular to the first direction 12 when viewed from above is referred to as a second direction 14, and a direction perpendicular to the plane including the first direction 12 and the second direction 14 is referred to as a third direction 16.

A carrier 1300 having substrates W received therein is placed on the load port 1200. A plurality of load ports 1200 may be provided. The load ports 1200 may be arranged in a row along the second direction 14. FIG. 1 illustrates an example that the index module 1000 includes four load ports 1200. However, the number of load ports 1200 may be increased or decreased depending on conditions such as the process efficiency and the footprint of the process module 2000. The carrier 1300 has slots (not illustrated) that are formed therein to support the edges of the substrates W. The slots are arranged in the third direction 16. The substrates W are stacked in the carrier 1300 in the state of being spaced apart from each other along the third direction 16. A Front Opening Unified Pod (FOUP) may be used as the carrier 1300.

The process module 2000 includes a buffer unit 2200, a transfer chamber 2400, and process chambers 2600. The transfer chamber 2400 is arranged such that the lengthwise direction thereof is parallel to the first direction 12. The process chambers 2600 are disposed on opposite sides of the transfer chamber 2400 along the second direction 14. The process chambers 2600 on the one side of the transfer chamber 2400 and the process chambers 2600 on the opposite side of the transfer chamber 2400 are located in a symmetric arrangement with respect to the transfer chamber 2400. Some of the process chambers 2600 on each side of the transfer chamber 2400 are arranged along the lengthwise direction of the transfer chamber 2400. Furthermore, the other process chambers 2600 are stacked one above another along the third direction 16. That is, the process chambers 2600 may be arranged in an A×B array (A and B being natural numbers of 1 or larger) on each side of the transfer chamber 2400. Here, "A" is the number of process chambers 2600 arranged in a row along the first direction 12, and "B" is the number of process chambers 2600 arranged in a column along the third direction 16. In the case where four or six process chambers 2600 are disposed on each side of the transfer chamber 2400, the process chambers 2600 may be arranged in a 2×2 or 3×2 array. The number of process chambers 2600 may be increased or decreased. Alternatively, the process chambers 2600 may be provided on only the one side of the transfer chamber 2400. In another case, the process chambers 2600 may be arranged in a single layer on the opposite sides of the transfer chamber 2400.

The buffer unit 2200 is disposed between the transfer frame 1400 and the transfer chamber 2400. The buffer unit 2200 provides a space in which the substrates W stay before transferred between the transfer chamber 2400 and the transfer frame 1400. The buffer unit 2200 has slots (not illustrated) therein, on which the substrates W are placed. The slots (not illustrated) are spaced apart from each other along the third direction 16. The buffer unit 2200 is open at one side opposite the transfer frame 1400 and at an opposite side opposite the transfer chamber 2400.

The transfer frame 1400 transfers the substrates W between the carriers 1300 placed on the load ports 1200 and the buffer unit 2200. An index rail 1420 and an index robot 1440 are provided in the transfer frame 1400. The index rail 1420 is arranged such that the lengthwise direction thereof is parallel to the second direction 14. The index robot 1440 is mounted on the index rail 1420 and rectilinearly moves along the index rail 1420 in the second direction 14. The index robot 1440 has a base 1441, a body 1442, and an index arm 1443. The base 1441 is installed so as to be movable along the index rail 1420. The body 1442 is combined with the base 1441. The body 1442 is movable along the third direction 16 on the base 1441. Furthermore, the body 1442 is rotatable on the base 1441. The index arm 1443 is combined with the body 1442 and is movable forward and backward relative to the body 1442. The index robot 1440 may include a plurality of index arms 1443 that operate individually. The index arms 1443 are stacked one above another along the third direction 16 with a spacing gap therebetween. Some of the index arms 1443 may be used to transfer the substrates W from the process module 2000 to the carriers 1300, and the other index arms 1443 may be used to transfer the substrates W from the carriers 1300 to the process module 2000. Accordingly, particles generated from the substrates W to be treated may be prevented from adhering to the treated substrates W in the process in which the index robot 1440 transfers the substrates W.

The transfer chamber 2400 transfers the substrates W between the buffer unit 2200 and the process chambers 2600 and between the process chambers 2600. A guide rail 2420 and a main robot 2440 are provided in the transfer chamber 2400. The guide rail 2420 is arranged such that the lengthwise direction thereof is parallel to the first direction 12. The main robot 2440 is mounted on the guide rail 2420 and rectilinearly moves along the first direction 12 on the guide rail 2420. The main robot 2440 has a base 2441, a body 2442, and a main arm 2443. The base 2441 is installed so as to be movable along the guide rail 2420. The body 2442 is combined with the base 2441. The body 2442 is movable along the third direction 16 on the base 2441. Furthermore, the body 2442 is rotatable on the base 2441. The main arm 2443 is combined with the body 2442 and is movable forward and backward relative to the body 2442. The main robot 2440 may include a plurality of main arms 2443 that operate individually. The main arms 2443 are stacked one above another along the third direction 16 with a spacing gap therebetween. The main arms 2443 used to transfer the substrates W from the buffer unit 2200 to the process chambers 2600 may differ from the main arms 2443 used to transfer the substrates W from the process chambers 2600 to the buffer unit 2200.

Each of the process chambers 2600 has a substrate treating apparatus 10 therein, which performs a cleaning process on a substrate W. The substrate treating apparatuses 10 in the respective process chambers 2600 may have different structures according to the types of cleaning processes performed by the substrate treating apparatuses 10. Alternatively, the substrate treating apparatuses 10 in the respective process chambers 2600 may have the same structure. In another case, the process chambers 2600 may be divided into a plurality of groups. The substrate treating apparatuses 10 in the process chambers 2600 belonging to the same group may have the same structure, and the substrate treating apparatuses 10 in the process chambers 2600 belonging to different groups may have different structures. For example, in the case where the process chambers 2600 are divided into two groups, a first group of process chambers 2600 may be disposed on the one side of the transfer chamber 2400, and a second group of process chambers 2600 may be disposed on the opposite side of the transfer chamber 2400. Alternatively, on the opposite sides of the transfer chamber 2400, the first group of process chambers 2600 may be disposed in a lower layer, and the second group of process chambers 2600 may be disposed in an upper layer. The first group of process chambers 2600 may be distinguished from the second group of process chambers 2600 according to the types of chemicals used and the types of cleaning processes.

An apparatus for removing a photoresist film and an organic residue from a substrate W by using treating fluids (e.g., an ozone treatment fluid containing ozone, a rinsing solution, and a drying gas) and an ultraviolet (or infrared) lamp will be described as an example in the following embodiment.

Figure 2:
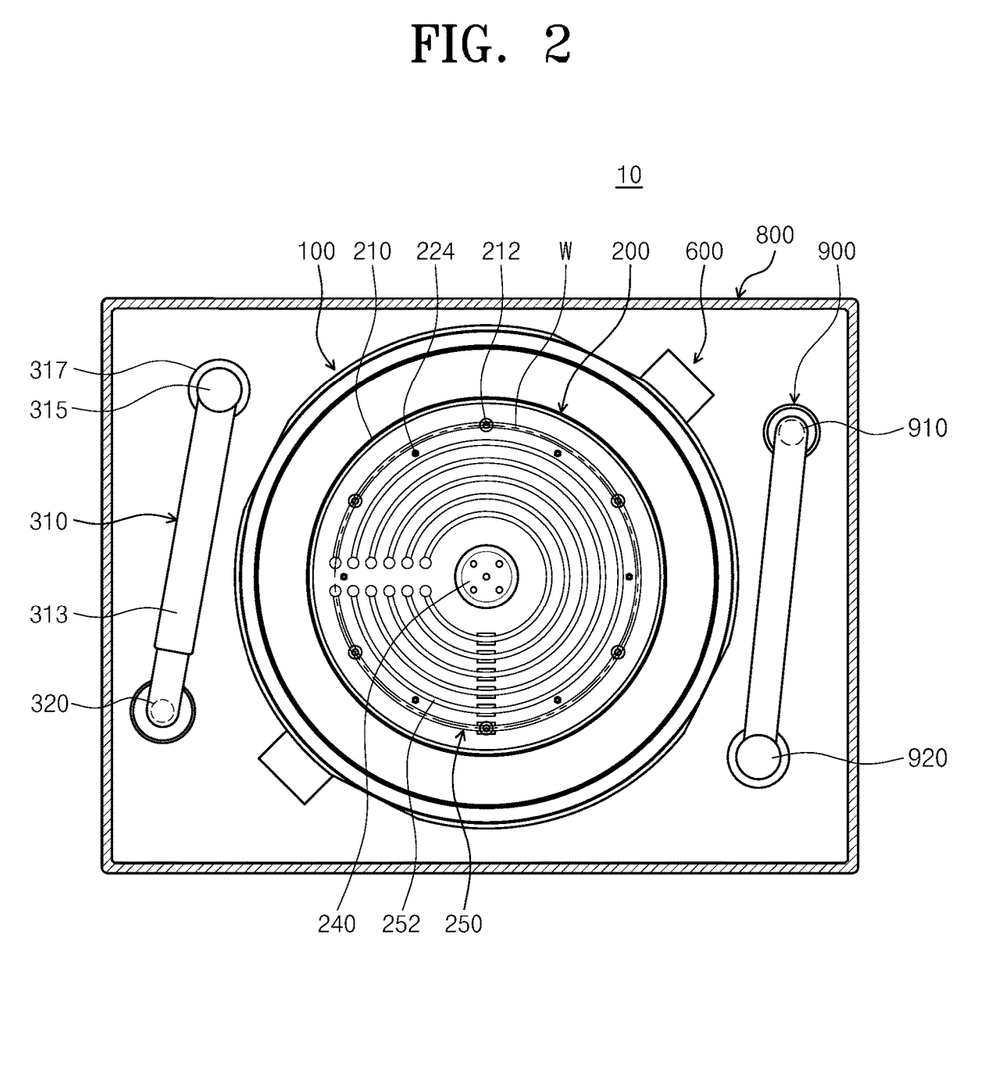
FIG. 2 is a plan view illustrating the substrate treating apparatus of FIG. 1.
Figure 3:
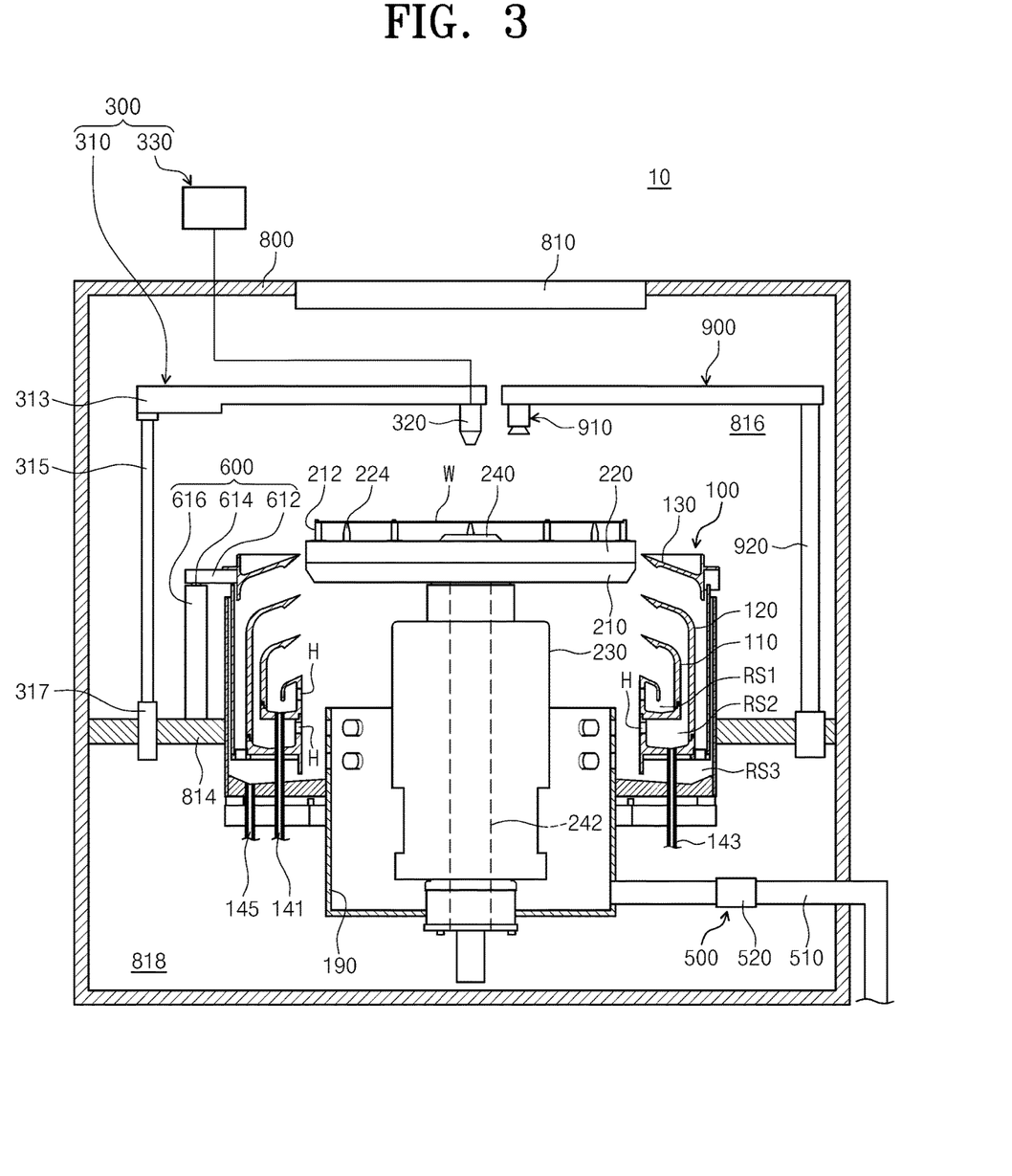
FIG. 3 is a sectional view illustrating the substrate treating apparatus of FIG. 1.

FIG. 2 is a plan view illustrating the substrate treating apparatus of FIG. 1, and FIG. 3 is a sectional view illustrating the substrate treating apparatus of FIG. 1.

Referring to FIGS. 2 and 3, the substrate treating apparatus 10 includes a chamber 800, a processing vessel 100, a substrate support unit 200, a heating unit 250, a treating fluid supply unit 300, a process exhaust unit 500, a lifting unit 600, and a lamp unit 900.

The chamber 800 has a sealed inner space. The chamber 800 is equipped with an air-flow supply unit 810 at the top thereof. The air-flow supply unit 810 forms a downward flow of air in the chamber 800.

The air-flow supply unit 810 filters and supplies high-humidity outside air into the chamber 800. The high-humidity outside air forms a downward air flow while being supplied into the chamber 800 through the air-flow supply unit 810. The downward air flow provides a uniform air flow over the substrate W and releases contaminants, which are generated in the process in which the surface of the substrate W is treated by the treating fluids, along with air to the process exhaust unit 500 through recovery bowls 110, 120, and 130 of the processing vessel 100.

The chamber 800 is partitioned into a process area 816 and a maintenance area 818 by a horizontal partition wall 814. The processing vessel 100 and the substrate support unit 200 are located in the process area 816. An actuator of the lifting unit 600, an actuator connected with the treating fluid supply unit 300, and a supply line are located in the maintenance area 818, in addition to drain lines 141, 143, and 145 connected with the processing vessel 100 and an exhaust line 510. The maintenance area 818 is isolated from the process area 816.

The processing vessel 100 has an open-topped cylindrical shape and provides a process space for treating the substrate W. The open top side of the processing vessel 100 serves as a passage through which the substrate W is carried into or out of the processing vessel 100. The substrate support unit 200 is located in the process space. The substrate support unit 200 rotates the substrate W while supporting the substrate W during a process.

The processing vessel 100 has, at the bottom thereof, a lower space to which an exhaust duct 190 is connected to perform forced exhaust. The processing vessel 100 includes the first to third recovery bowls 110, 120, and 130 that are disposed in multiple stages and that take in the treating fluids and gases scattered over the rotating substrate W.

The first to third annular recovery bowls 110, 120, and 130 have exhaust holes H that connect to one common annular space.

Specifically, each of the first to third recovery bowls 110, 120, and 130 includes a bottom wall having an annular ring shape and a sidewall having a cylindrical shape extending from the bottom wall. The second recovery bowl 120 surrounds the first recovery bowl 110 and is spaced apart from the first recovery bowl 110. The third recovery bowl 130 surrounds the second recovery bowl 120 and is spaced apart from the second recovery bowl 120.

The first to third recovery bowls 110, 120, and 130 have first to third recovery spaces RS1, RS2, and RS3, respectively, into which a gas flow containing the treating fluids and fumes scattered from the substrate W is introduced. The first recovery space RS1 is defined by the first recovery bowl 110, the second recovery space RS2 is defined by the spacing space between the first recovery bowl 110 and the second recovery bowl 120, and the third recovery space RS3 is defined by the spacing space between the second recovery bowl 120 and the third recovery bowl 130.

The top side of each of the first to third recovery bowls 110, 120, and 130 is open in the center. The first to third recovery bowls 110, 120, and 130 each include an inclined wall that is upwardly inclined such that the distance between the inclined wall and the corresponding bottom wall gradually increases from the sidewall to the open top side. The treating fluids scattered from the substrate W flow into the recovery spaces RS1, RS2, and RS3 along the top sides of the first to third recovery bowls 110, 120, and 130.

A first treating liquid introduced into the first recovery space RS1 is discharged to the outside through the first recovery line 141. A second treating liquid introduced into the second recovery space RS2 is discharged to the outside through the second recovery line 143. A third treating liquid introduced into the third recovery space RS3 is discharged to the outside through the third recovery line 145.

The process exhaust unit 500 is responsible for evacuation of the processing vessel 100. For example, the process exhaust unit 500 applies exhaust pressure (suction pressure) to a recovery bowl that recovers a treating fluid during a process, among the first to third recovery bowls 110, 120, and 130. The process exhaust unit 500 includes the exhaust line 510 connected with the exhaust duct 190 and a damper 520. The exhaust line 510 receives exhaust pressure from an exhaust pump (not illustrated) and is connected with a main exhaust line buried beneath the floor of a semiconductor manufacturing line.

The processing vessel 100 is combined with the lifting unit 600 that varies the vertical position of the processing vessel 100. The lifting unit 600 rectilinearly moves the processing vessel 100 in the vertical direction. The height of the processing vessel 100 relative to the substrate support unit 200 is varied as the processing vessel 100 is vertically moved.

The lifting unit 600 includes a bracket 612, a movable shaft 614, and an actuator 616. The bracket 612 is fixedly attached to an outer wall of the processing vessel 100. The movable shaft 614 is fixedly combined with the bracket 612 and vertically moved by the actuator 616. When the substrate W is loaded onto, or unloaded from, a chuck stage 210, the processing vessel 100 is lowered to allow the chuck stage 210 to further protrude beyond the processing vessel 100. Furthermore, during the process, the height of the processing vessel 100 is adjusted according to the types of treating fluids supplied onto the substrate W, to allow the treating fluids to be introduced into the preset recovery bowls 110, 120, and 130, respectively. The vertical position of the processing vessel 100 relative to the substrate W is varied. The processing vessel 100 may vary the types of treating fluids and pollutant gases recovered into the respective recovery spaces RS1, RS2, and RS3. According to an embodiment, the lifting unit 600 vertically moves the processing vessel 100 to vary the vertical position of the processing vessel 100 relative to the substrate support unit 200.

The substrate support unit 200 may support the substrate W during the process. The substrate support unit 200 may be rotated by an actuator 242 during the process.

The substrate support unit 200 includes the chuck stage 210, a quartz window 220, a rotary unit 230, a back nozzle 240, and the heating unit 250.

The chuck stage 210 has a circular upper surface. The chuck stage 210 is combined with and rotated by the rotary unit 230.

The rotary unit 230 has a hollow shape. The rotary unit 230 is combined with the chuck stage 210 and rotates the chuck stage 210.

The quartz window 220 is located on the chuck stage 210. The quartz window 220 protects the heating unit 250. The quartz window 220 may be transparent. The quartz window 220 may be rotated together with the chuck stage 210. The quartz window 220 includes support pins 224. The support pins 224 are arranged on a peripheral portion of an upper surface of the quartz window 220 with a predetermined interval therebetween. The support pins 224 protrude upward from the quartz window 220. The support pins 224 support the backside of the substrate W to space the substrate W apart upward from the quartz window 220.

Chucking pins 212 are located on the quartz window 220. The chucking pins 212 align the substrate W to locate the substrate W, which is supported by the plurality of support pins 224, in a correct position. During the process, the chucking pins 212 make contact with the side of the substrate W to prevent the substrate W from deviating from the correct position.

The back nozzle 240 dispenses high-temperature deionized water onto the backside of the substrate W.

The heating unit 250 is mounted in the substrate support unit 200. The heating unit 250 heats the substrate W during a stripping process. The heating unit 250 is installed at the top of the chuck stage 210. A plurality of heating units 250 may be provided. The heating units 250 may have different diameters. The heating units 250 may have a ring shape. For example, the heating units 250 may be implemented with a plurality of lamps 252 in a ring shape. The lamps 252 may be controlled by temperature controllers (not illustrated), respectively. The heating units 250 may be subdivided into a plurality of concentric sections. The lamps 252 are provided in the sections to individually heat the sections, respectively. The lamps 252 may be ring-shaped lamps concentrically arranged at different radii with respect to the center of the chuck stage 210.

The lamp unit 900 raises the temperature of the surface of the substrate W (a photoresist film) in the process of treating the surface of the substrate W and irradiates light to the substrate W to enhance the reactivity with the ozone treatment fluid and activate OH radicals. The lamp unit 900 may include a lamp 910 and a lamp actuator 920 for moving the lamp 910 above the substrate W. The lamp 910 may be a lamp that irradiates ultraviolet light. However, without being limited thereto, the lamp 910 may include a lamp that irradiates infrared light, or may include two lamps that irradiate ultraviolet light and infrared light, respectively.

The treating fluid supply unit 300 dispenses, onto the substrate W, the ozone treatment fluid for removing unnecessary photoresist and an organic residue on the surface of the substrate W. For example, the ozone treatment fluid may be a fluid mixture that contains ozone and deionized water (DIW). The ozone may be used in the state of being mixed with (dissolved in) the deionized water, and a nitrogen gas and a carbon dioxide gas may be added as catalytic gases when necessary.

For example, a treating fluid supply unit using an ozone-steam mixture will be described below.

Figure 4:
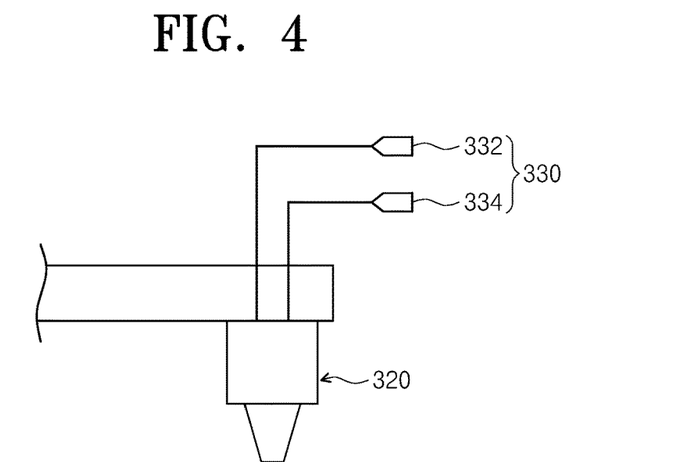
FIG. 4 is a view illustrating a fluid supply unit.
Figure 5:
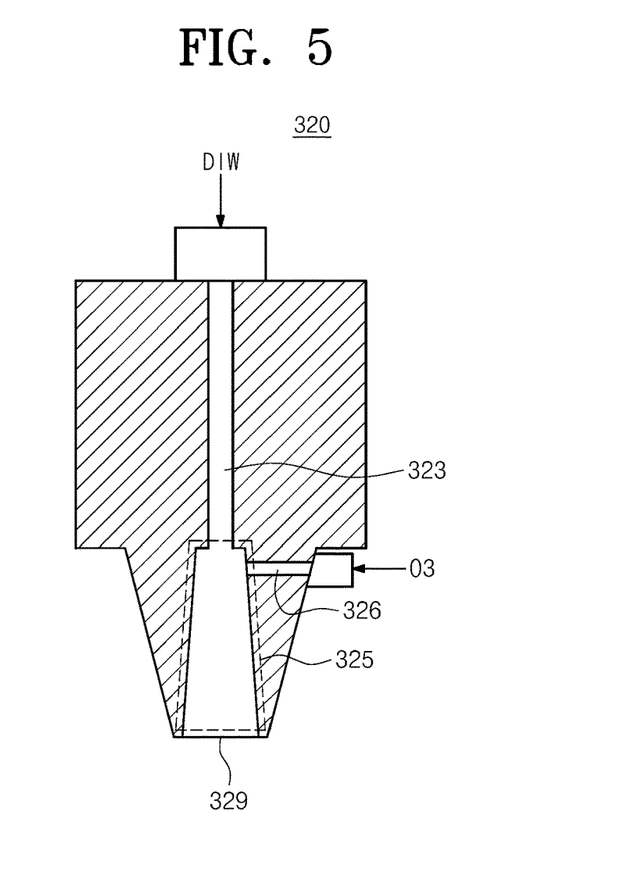
FIG. 5 is a sectional view illustrating a nozzle.

FIG. 4 is a view illustrating a fluid supply unit, and FIG. 5 is a sectional view illustrating a nozzle.

Referring to FIGS. 3 to 5, the treating fluid supply unit 300 may include a nozzle member 310 and the fluid supply unit 330.

The nozzle member 310 includes the nozzle 320, a nozzle arm 313, a support rod 315, and a nozzle actuator 317. The nozzle 320 is supplied with fluids through the fluid supply unit 330.

The fluid supply unit 330 may include an ozone gas supply unit 332 for supplying an ozone gas used to remove the photoresist film on the substrate W and a deionized-water supply unit 334 for supplying deionized water used to remove the photoresist film on the substrate W.

The nozzle 320 dispenses the ozone treatment fluid onto the surface of the substrate W. The nozzle arm 313 extends in one direction and is equipped with the nozzle 320 at the tip end thereof. The nozzle arm 313 supports the nozzle 320. The nozzle arm 313 is equipped with the support rod 315 at a rear end thereof. The support rod 315 is located on the bottom of the nozzle arm 313. The support rod 315 is arranged perpendicular to the nozzle arm 313. The nozzle actuator 317 is provided at a lower end of the support rod 315. The nozzle actuator 317 rotates the support rod 315 about the longitudinal axis of the support rod 315. The nozzle arm 313 and the nozzle 311 swing about the support rod 315 by the rotation of the support rod 315. The nozzle 320 may swing between outside and inside the processing vessel 100 during the stripping process. Further, the nozzle 320 may dispense the ozone treatment liquid while swinging between the center of the substrate W and the edge region thereof.

The nozzle 320 may include a mixing space 325 and a dispensing opening 329. The deionized water is supplied into the mixing space 325. The ozone gas supplied from the ozone gas supply unit 322 through an ozone inflow passage 326 is introduced into the mixing space 325 and brought into contact with the deionized water in the mixing space 325. The ozone gas is dissolved in the deionized water. The high-concentration ozone water (the ozone treatment fluid) that is prepared in the mixing space 325 is dispensed onto the surface of the substrate W through the dispensing opening 329.

The ozone may react with the unnecessary photoresist and the organic residue on the substrate W before decomposed, because the ozone treatment fluid is prepared in the nozzle 320 and dispensed onto the substrate W.

Figure 6:
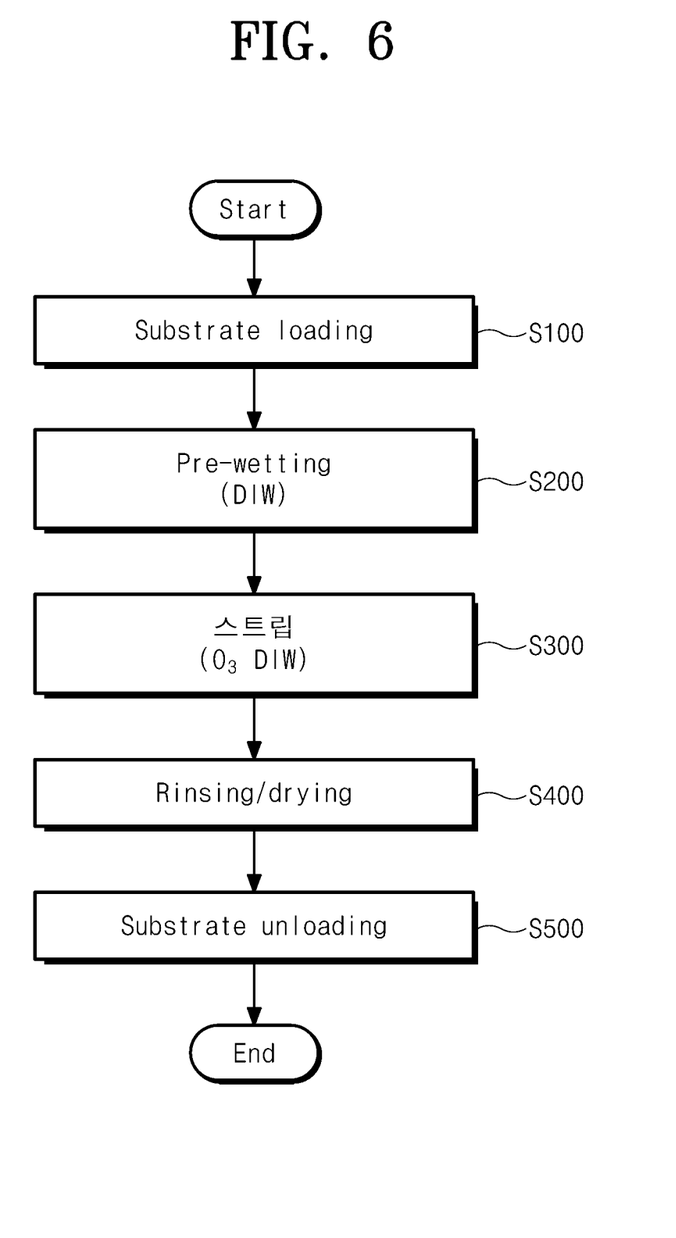
FIGS. 6 and 7 are views illustrating a stripping process in the substrate treating apparatus according to an embodiment of the inventive concept.
Figure 7:
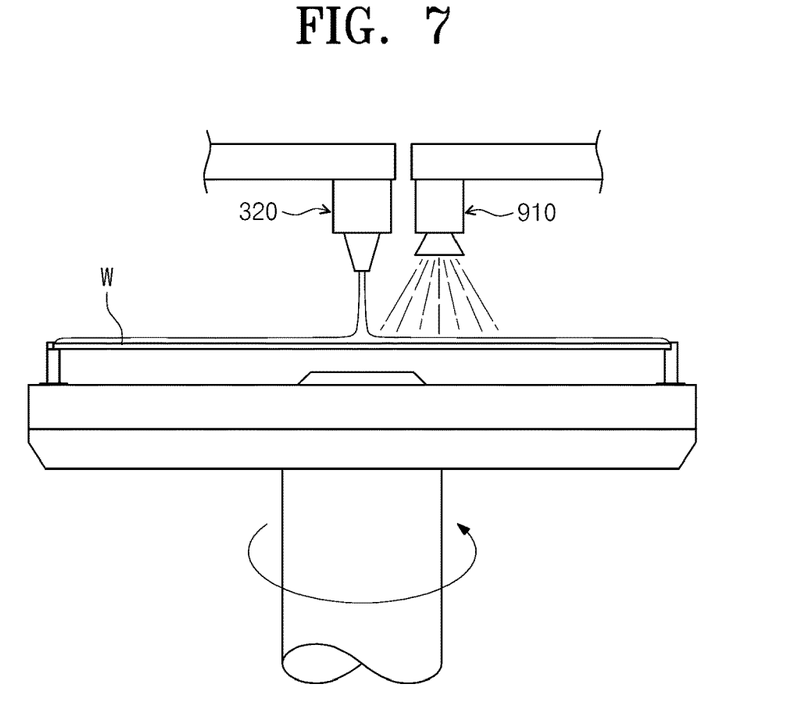

FIGS. 6 and 7 are views illustrating a stripping process in the substrate treating apparatus according to an embodiment of the inventive concept.

Referring to FIGS. 6 and 7, the stripping process may include a substrate loading step S100, a pre-wetting step S200, a stripping step S300, a rinsing/drying step S400, and a substrate unloading step S500.

In the substrate loading step S100, a substrate is loaded onto the substrate support unit 200. In the pre-wetting step S200, deionized water is dispensed onto the rotating substrate to wet the surface of the substrate. In the stripping step S300, ozone steam is dispensed onto the surface of the rotating substrate. At this time, the nozzle 320 dispenses the ozone steam to strip a photoresist film and an organic residue from the substrate, while swinging from the center of the substrate to the edge of the substrate, or while swinging from the edge of the substrate to the center of the substrate. In the stripping step S300, ultraviolet (UV) light may be irradiated to enhance activation of OH radicals of the ozone treatment fluid while the ozone treatment fluid is dispensed onto the surface of the substrate.

In the rinsing/drying step S400, the surface of the substrate is rinsed by using a rinsing solution, and thereafter the substrate is dried by using a drying fluid.

Meanwhile, in the stripping step S300, the substrate may be heated to induce the activation of the OH radicals. The substrate may be heated by a heater or by high-temperature deionized water dispensed onto the backside of the substrate by the back nozzle 240.

Figure 8:
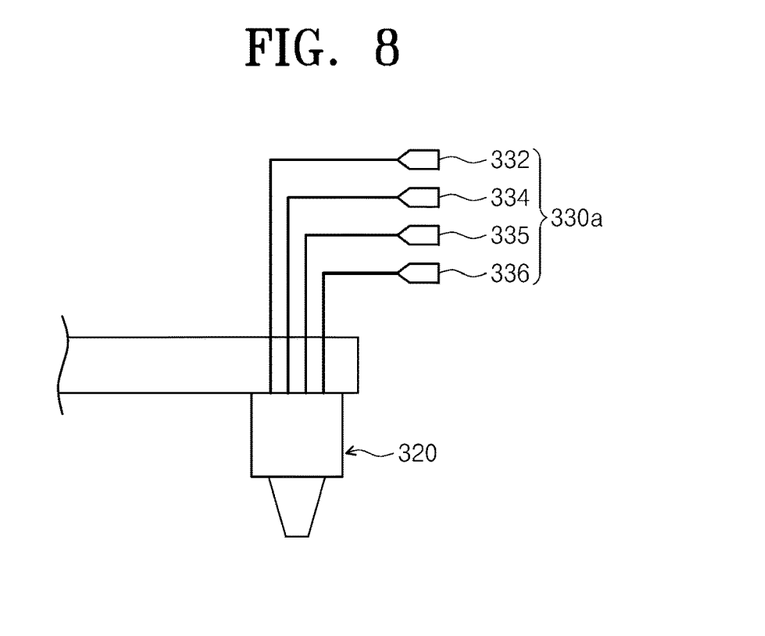
FIG. 8 is a view illustrating another embodiment of the fluid supply unit.

As illustrated in FIG. 8, a fluid supply unit 330a may further include a nitrogen supply unit 335 and a carbon dioxide supply unit 336, in addition to the ozone gas supply unit 332 and the deionized-water supply unit 334. A nitrogen gas and carbon dioxide may be supplied into the nozzle 320 through the ozone inflow passage 326 illustrated in FIG. 5. The nitrogen gas and the carbon dioxide are catalytic gases for maintaining the ozone concentration of the ozone treatment fluid at high concentration. The nitrogen gas serves as a catalyst that increases the rate of decomposition of $O_2$ to O, and the carbon dioxide serves as an inhibitor that decreases the rate of decomposition of $O_3$ to $O_2$.

Figure 9:
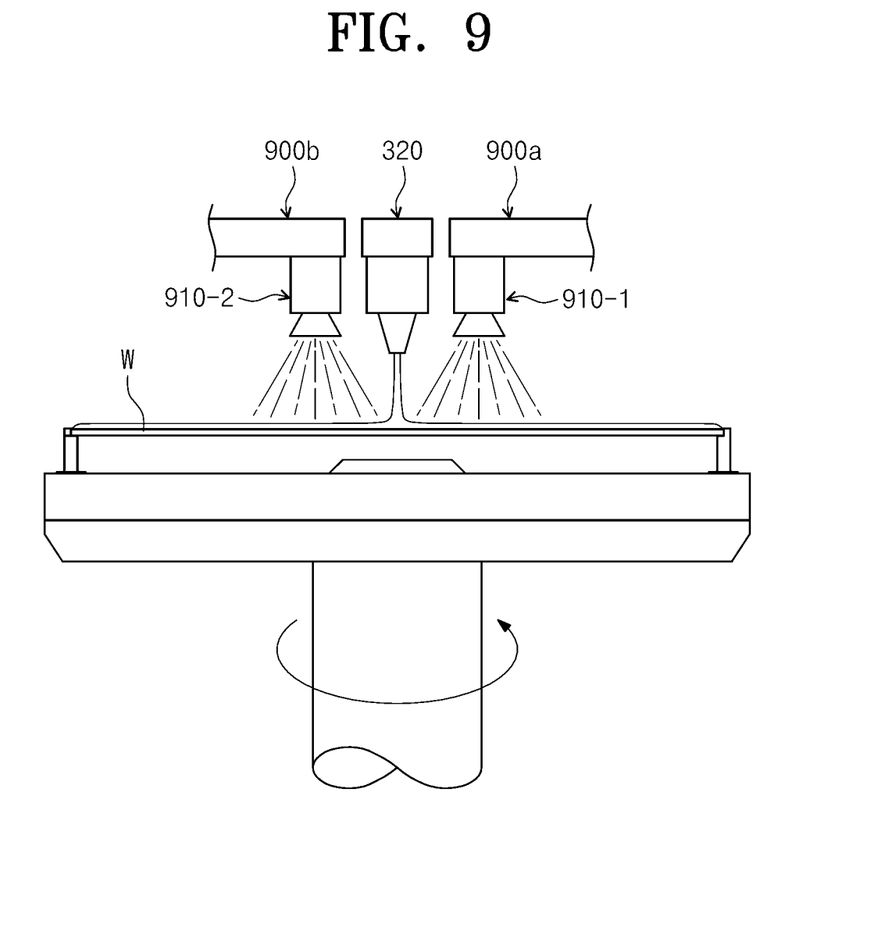
FIG. 9 is a view illustrating a modified embodiment of the inventive concept.

FIG. 9 is a view illustrating a modified embodiment of the inventive concept.

As illustrated in FIG. 9, the substrate treating apparatus 10 may include a first lamp unit 900a having a first lamp 910-1 that irradiates ultraviolet light and a second lamp unit 900b having a second lamp 910-2 that irradiates infrared light. The first lamp 910-1 and the second lamp 910-2 may individually irradiate ultraviolet light and infrared light to a substrate in a stripping process. The first lamp 910-1 and the second lamp 910-2 may be individually moved by lamp actuators (not illustrated) that are independent of each other.

For example, a krypton-fluoride (KrF) photoresist (PR) contains a photo acid generator (PAG), a resin, an inhibitor, and a solvent. The PAG is decomposed to H+ by ultraviolet (UV) light and discharged. Further, when the substrate (the PR) is heated to a temperature of 120° C. to 130° C. by infrared light, H+ diffuses so that the resin becomes soluble in water, thereby improving stripping efficiency.

Accordingly, when ultraviolet light and infrared light are irradiated to the substrate while an ozone treatment fluid is dispensed onto the substrate in the stripping process, the infrared light heats the substrate and improves the reactivity of the ozone water, and the ultraviolet light allows the PR to become soluble in water and enhances activation of OH radicals.

Figure 10:
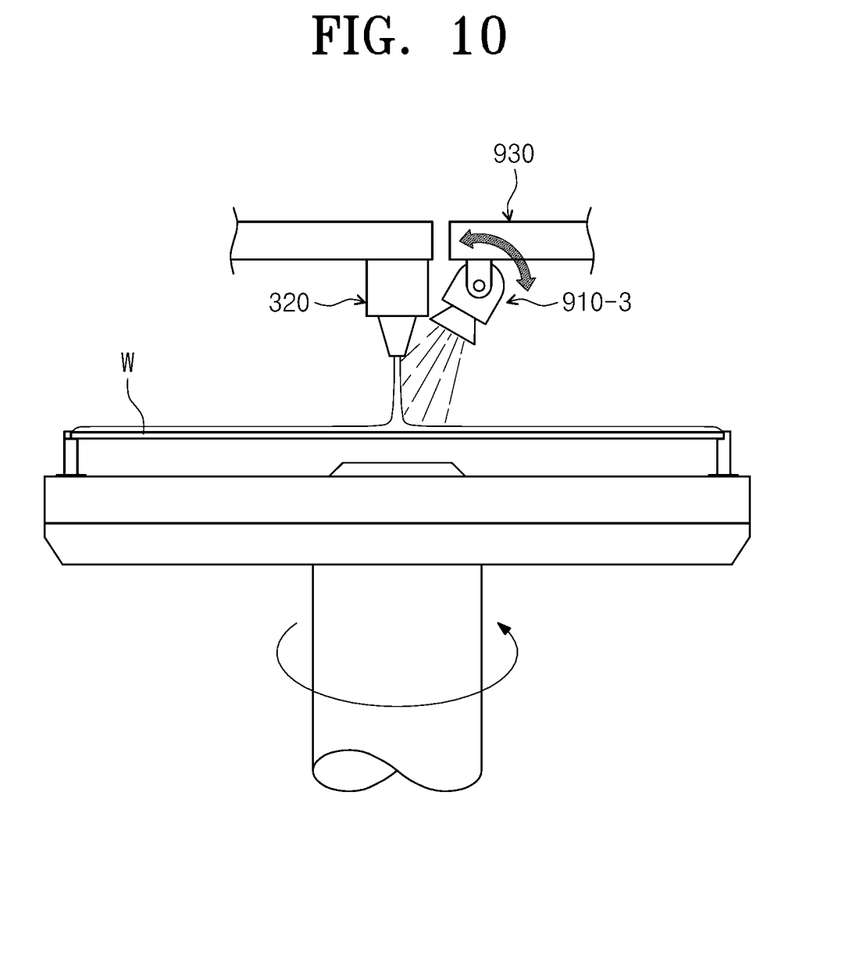
FIG. 10 is a view illustrating another modified embodiment of the inventive concept.

FIG. 10 is a view illustrating another modified embodiment of the inventive concept.

As illustrated in FIG. 10, a lamp 910-3 of the lamp unit 900b may be mounted on a lamp support 930 so as to be rotatable. Accordingly, the aiming direction of the lamp 910-3 may be adjusted such that light irradiated by the lamp 910-3 is directed toward the point onto which the nozzle 320 dispenses the ozone treatment fluid.

Figure 11:
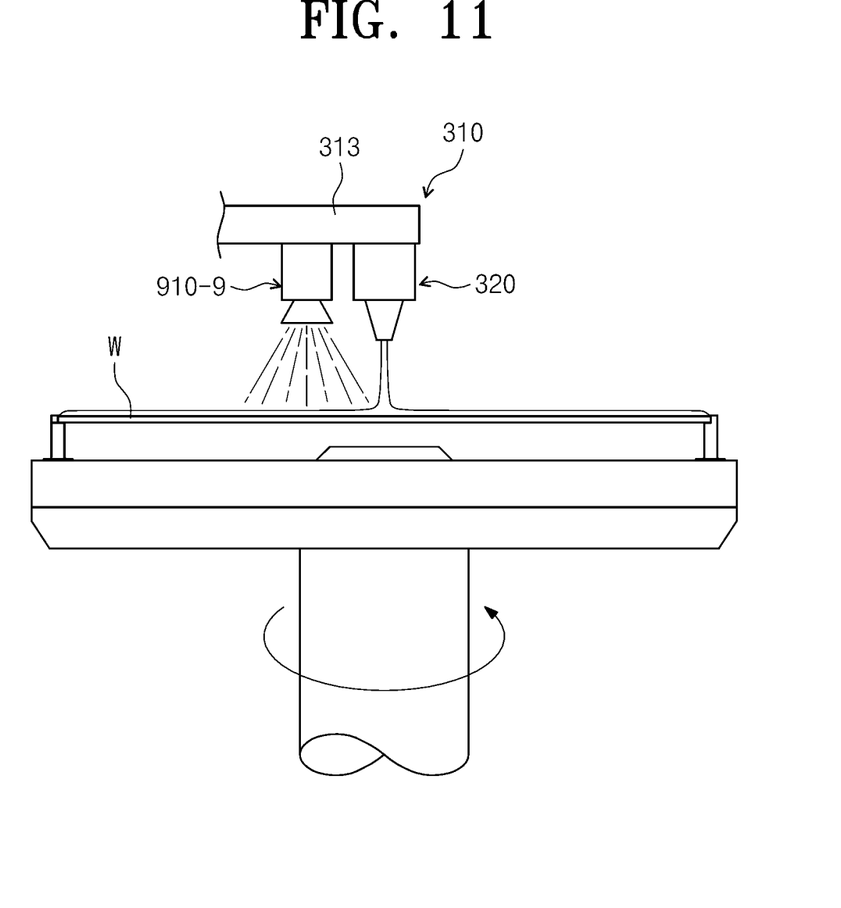
FIG. 11 is a view illustrating another modified embodiment of the inventive concept.

FIG. 11 is a view illustrating another modified embodiment of the inventive concept.

As illustrated in FIG. 11, a lamp 910-9 may be installed on the nozzle arm 313 of the nozzle member 310. That is, the lamp 910-9 may be disposed adjacent to the nozzle 320 and may irradiate light (infrared or ultraviolet light) to a substrate while moving together with the nozzle 320 in the same direction. Although not illustrated, a plurality of lamps may be mounted on the nozzle arm 313.

As described above, the inventive concept may remove photoresist and an organic residue by using ozone water rather than sulfuric acid. The ozone water, after used, is decomposed into an ozone gas and water. Thus, wastewater treatment cost is saved and environmental pollution is not caused. Meanwhile, in implantation or PLAD stripping, the ozone water has lower PR stripping performance than the sulfuric acid, and therefore activation of OH radicals is required. Accordingly, in the inventive concept, ultraviolet light and infrared light are irradiated to a substrate to contribute to the activation of the OH radicals.

According to the embodiments, the substrate treating apparatus and method uses an ozone gas rather than sulfuric acid, thereby saving wastewater treatment cost and not causing environmental pollution.

Furthermore, the substrate treating apparatus and method irradiates infrared light or ultraviolet light to ozone water dispensed onto a substrate, thereby improving efficiency in removing a photoresist film and an organic residue.

Moreover, the substrate treating apparatus and method adds a nitrogen gas and carbon dioxide, as catalytic gases, to high-concentration ozone steam (or ozone water), thereby increasing the rate of decomposition of $O_2$ to O and decreasing the rate of decomposition of $O_3$ to $O_2$, which in turn maintains the ozone at high concentration until the zone reaches the surface of a substrate.

In addition, the substrate treating apparatus and method prepares ozone steam in the dispensing nozzle and dispenses the ozone steam onto a substrate, thereby enabling the ozone to react with a photoresist film and an organic residue on a substrate before the ozone is decomposed.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a chamber;
   a substrate support unit on which the substrate is placed, the substrate support unit being provided in the chamber;
   an ozone gas supply unit configured to supply an ozone gas;
   a dispensing nozzle configured to dispense, onto the substrate, an ozone treatment fluid containing the ozone gas supplied from the ozone gas supply unit;
   a lamp unit configured to irradiate light to the substrate; and
   a deionized-water supply unit configured to supply deionized water to the dispensing nozzle,
   wherein the dispensing nozzle includes a mixing space in which the deionized water supplied from the deionized-water supply unit and the ozone gas supplied from the ozone gas supply unit are mixed, and
   wherein the ozone gas supplied from the ozone gas supply unit through an ozone inflow passage is introduced into the mixing space and brought into contact with the deionized water in the mixing space.

2. The apparatus of claim 1, wherein the dispensing nozzle further includes
   a dispensing opening through which the ozone treatment fluid prepared in the mixing space is dispensed.

3. The apparatus of claim 1, wherein the lamp unit irradiates the light to a region of the substrate onto which the ozone treatment fluid is dispensed.

4. The apparatus of claim 3, wherein the lamp unit includes an infrared (IR) lamp configured to irradiate infrared light.

5. The apparatus of claim 3, wherein the lamp unit includes an ultraviolet (UV) lamp configured to irradiate ultraviolet light.

6. The apparatus of claim 3, wherein the lamp unit includes a UV lamp configured to irradiate ultraviolet light and an IR lamp configured to irradiate infrared light.

7. The apparatus of claim 1, wherein the substrate support unit includes a heating unit configured to heat the substrate.

8. The apparatus of claim 1, wherein the substrate support unit includes a back nozzle configured to dispense a high-temperature fluid higher than room temperature onto a backside of the substrate.

9. The apparatus of claim 1, further comprising:
a nozzle actuator configured to swing the dispensing nozzle to dispense the ozone treatment fluid while moving from the center of the substrate to the edge thereof.

10. The apparatus of claim 9, further comprising:
an arm on which the dispensing nozzle and the lamp unit are mounted,
wherein the arm is operated by the nozzle actuator.

11. The apparatus of claim 1, further comprising:
a moving unit configured to move the dispensing nozzle and the lamp unit to vary positions of the dispensing nozzle and the lamp unit relative to the substrate support unit; and
a controller configured to control the moving unit to vary a region of the substrate to which the ozone treatment fluid and the light are supplied.

12. The apparatus of claim 1, wherein the dispensing nozzle and the lamp unit are individually operated by separate actuators.

13. The apparatus of claim 2, further comprising:
a catalytic gas supply unit configured to supply a catalytic gas to the dispensing nozzle.

14. The apparatus of claim 13, wherein the catalytic gas supply unit supplies the catalytic gas into the mixing space.

15. The apparatus of claim 13, wherein the catalytic gas includes at least one of a nitrogen gas and carbon dioxide.

* * * * *